United States Patent [19] [11] Patent Number: 4,851,668
Ohno et al. [45] Date of Patent: Jul. 25, 1989

[54] ION SOURCE APPLICATION DEVICE

[75] Inventors: Yasunori Ohno; Tomoe Kurosawa, both of Hitachi; Tadashi Sato, Mito; Yukio Kurosawa, Hitachi; Yoshimi Hakamata, Hitachi, all of Japan

[73] Assignee: Hitachi, Ltd., Tokyo, Japan

[21] Appl. No.: 35,031

[22] Filed: Apr. 6, 1987

[30] Foreign Application Priority Data

Apr. 4, 1986 [JP] Japan .................... 61-77751

[51] Int. Cl.⁴ .................... H01J 37/00; H05H 3/00
[52] U.S. Cl. .................... 250/251; 250/423 R; 250/492.3
[58] Field of Search ............ 250/423 P, 492.3, 492.2, 250/492.21, 424, 423 R, 251; 313/359.1, 360.1; 315/111.81, 111.71, 111.21, 111.31, 111.41

[56] References Cited

U.S. PATENT DOCUMENTS 3,956,666  5/1976  Reader et al. ............... 315/111.81
4,713,585 12/1987  Ohno et al. ................. 315/111.81
4,716,491 12/1987  Ohno et al. ................. 361/230

FOREIGN PATENT DOCUMENTS 0040845  3/1982  Japan ............... 250/423 R
0046784  3/1984  Japan .
0235337 11/1985  Japan ............... 315/111.81

OTHER PUBLICATIONS

Pak et al., Broad Beam Ion Source Operation with Four Common Gases, Rev. Scilnstrom 51(4), Apr., 1980, pp. 536–539.
Leung et al. Summary Abstract: Ratio Frequency Ion Source Development for Neutral Beam Applications, J. Voc. Sci. Tech, 2(2), Apr. Je 1984.

Primary Examiner—Bruce C. Anderson
Attorney, Agent, or Firm—Antonelli, Terry & Wands

[57] ABSTRACT

An ion source application device comprising a gas tight plasma formation chamber sustaining a plasma produced by high frequency discharge, a high frequency coil producing the high frequency discharge, and means for extracting an ion beam from the plasma thus produced, characterized in that it comprises further an electron beam generator or a laser light generator as means for obtaining electrons serving as seeds for starting the high frequency discharge.

3 Claims, 5 Drawing Sheets

ION SOURCE APPLICATION DEVICE

BACKGROUND OF THE INVENTION

This invention relates to an ion source application device and in particular to an ion source application device used in an ion beam etching device, an ion implantation device, a neutral beam injector, etc.

Recently ion beams have been widely utilized for fabrication and working of semiconductor devices and functional thin films (e.g. films for the magnetic head). For example an ion beam etching device using microwaves has been proposed in JP-A-59-46748 as a dry etching device, which is indispensable for fabricating so-called submicron devices. The dry etching is a method, by which gas plasma or ion beam is used for etching, contrarily to the etching of a semiconductor surface by means of liquid. When such a device is used, high precision etching is possible. At the same time, even in the case where oxygene or reactive gas such as fluorine, chlorine, etc. is used, it gives rise to no problem that a filament is consumed as in an etching device, in which an electron bombardment type ion source is used, and has an advantage to stand a long time use. However, since this device produces plasma by using the electron cyclotron resonance (ECR), it is difficult to obtain a uniform ion beam in a wide region and therefore it is not suitable for an application, in which a number of wafers are treated simultaneously.

On the other hand Lawrence Berkeley Laboratory in U.S.A. has developed a high frequency ion source as an ion source used in a neutral beam injector for the nuclear fusion and succeeded to obtain a hydrogene ion beam having a uniform intensity over 100 mm×100 mm. This is reported in "Radio Frequency Ion Source Development for Neutral Beam Applications" (K. N. Leung et al., J. Vac. Sci. Technol. A2(2), Apr.–June 1984). When this ion source is applied to the etching device stated above, advantages are obtained that an ion beam, which is uniform over a wide region, is obtainable and at the same time that it can be stably driven during a long period of time as compared with an electron bombardment type ion source even in a reactive gas for generating high frequency discharge at the plasma production.

However, although the ion source developed by Berkeley Laboratory described above utilizes high frequency discharge, electrons serving as seeds for starting it are obtained by lightening a filament during a short time at the beginning of the discharge. Therefore it has a problem that the life of the ion source is shortened by the consumption of the filament.

SUMMARY OF THE INVENTION

The object of this invention is to provide an ion source permitting to obtain an ion beam, which is uniform in a wide region, and at the same time having a long life.

According to this invention, one of an electron beam generator and a laser light generator is used as means for obtaining electrons serving as seeds for starting high frequency discharge. Further, here, the electron beam generator comprises a generator producing an electron beam having no directivity i.e., an omnidirectional electron beam.

When electrons produced by the electron beam generator are supplied to a plasma formation chamber, high frequency discharge is started by these supplied electrons. Further, when laser light produced by the laser light generator is supplied to the plasma formation chamber, gas in the plasma formation chamber is ionized and electrons generated at that time serve as seeds, thus starting the high frequency discharge.

DESCRIPTION OF THE PREFERRED EMBODIMENTS

Figure 1:
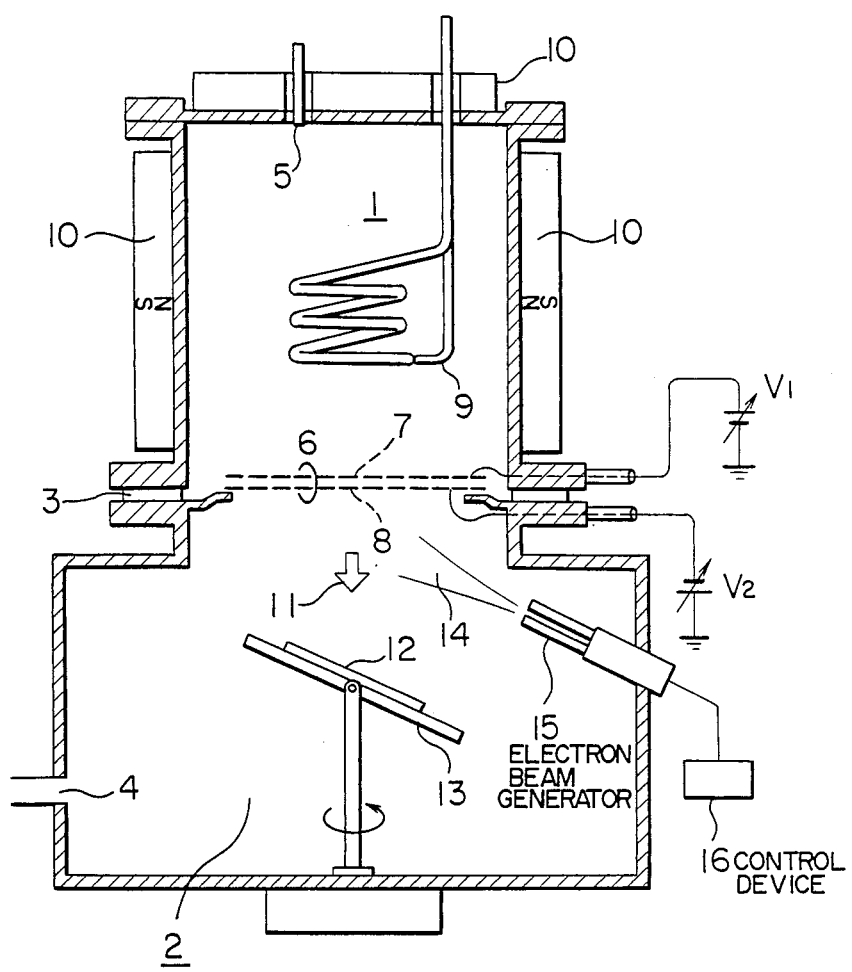
FIG. 1 is a longitudinal cross-sectional view illustrating an ion source application device, which is a first embodiment of this invention.

FIG. 1 is a longitudinal cross-sectional view illustrating an ion source application device, which is a first embodiment of this invention and FIGS. 2A to 2E show a time chart for explaining the working mode at the beginning of the high frequency discharge for the first embodiment. In this embodiment indicated in FIG. 1, this invention is applied to an ion beam etching device. Electrons 14 coming from an electron beam generator 15 disposed for preventing an object 12 to be worked located in a working chamber 2 from charging up are introduced temporarily into a plasma formation chamber 1 at the beginning of the high frequency discharge so as to start it.

That is, in FIG. 1, the plasma formation chamber 1 and the working chamber 2 are formed in the form of one gas-tight vessel with an isolator 3 inserted therebetween. They are evacuated to about $1.33 \times 10^{-4}$ Pa ($1 \times 10^{-6}$ Torr) through an exhaust port 4 disposed at a part of the working chamber 2. Thereafter e.g. freon gas ($CF_4$) is introduced therein through a gas inlet 5 and the gas pressure (on the working chamber side) is regulated to about $1.33 \times 10^{-2}$ Pa ($1 \times 10^{-4}$ Torr). Between the plasma formation chamber 1 and the working chamber 2 are disposed a first grid 7 and a second grid 8 constituting an ion beam extracting electrode 6. A positive DC voltage $V_1$ (e.g. +500 V) is applied to the first grid 7 and a negative DC voltage $V_2$ (e.g. −200 V) to the second grid 8. Further the ion beam extracting electrode 6 is utilized, as stated later, both for introducing electrons 14 in the plasma formation chamber 1 for producing the high frequency discharge and for extracting ions in the form of an ion beam 11 from the plasma formation chamber 1 to the working chamber 2 after the generation of the plasma.

On the other hand, in the plasma formation chamber 1 is disposed a high frequency coil 9 for generating the high frequency discharge and at the same time permanent magnets 10 having a multiple structure are disposed around the plasma formation chamber 1 for producing magnetic field forcing back plasma diffusing towards the wall of the plasma formation chamber 1 towards the center thereof. In addition, in the working chamber 2 is disposed a supporter 13 for the object 12, which is to be worked by the ion beam 11 extracted by means of the ion beam extracting electrode 6. Furthermore, in the case where the object 12 to be worked is an insulator, when it is irradiated with an ion beam, positive electric charge is accumulated thereon. Thus the electron beam generator 15 is disposed, which generates electrons 14 for preventing this charge accumulation. The second grid 8 is disposed for the purpose of preventing electrons on the working chamber 2 side to flow into the plasma formation chamber 1. As stated later, it is regulated to be at the ground potential at the beginning of the high frequency discharge and at a negative potential after the high frequency discharge has been started so that the flow of the electrons into the plasma formation chamber 1 is prevented. The electron beam generator 15 is controlled by a control device 16.

In the construction described above, when the high frequency discharge is started in the plasma formation chamber 1, the high frequency electric power supplied to the high frequency coil 9, the voltages applied to the first grid 7 and the second grid 8 and the input current of the electron beam generator 15 are controlled with a relation indicated in FIGS. 2A to 2E.

Figure 2A:
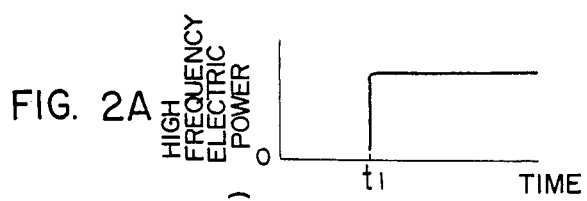
FIGS. 2A to 2E show a time chart for explaining the working mode at the beginning of the high frequency discharge for the above first embodiment.
Figure 2B:
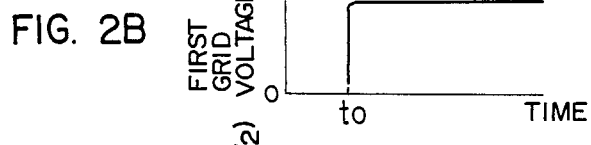
Figure 2C:
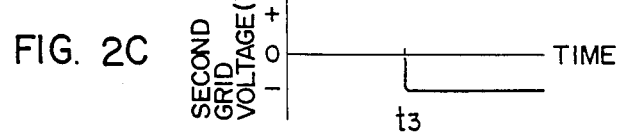
Figure 2D:
Figure 2E:
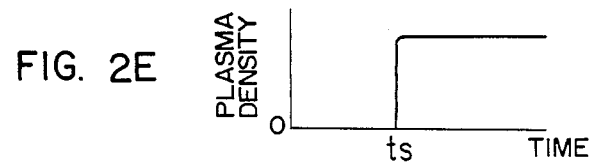

That is, at a point of time $t_o$ the first grid 7 is raised to a high voltage and at the same time a current is inputted to the electron beam generator 15 so as to generate electrons 14. At this time the second grid 8 is controlled to be at the ground potential. Since the electrons 14 are nearly at the ground potential, the electrons 14 are accelerated by the positive high voltage applied to the first grid 7 and projected into the plasma formation chamber 1. Next, a high frequency electric power is supplied to the high frequency coil 9 at a point of time $t_1$. Then the high frequency discharge is started at a point of time $t_S$, which is somewhat later than the point of time $t_1$, and the plasma density increases rapidly, as indicated in FIG. 2E. Since the high frequency discharge is sustained thereafter, a negative voltage is applied to the second grid 8 and at the same time the input current supplied to the electron beam generator 15 is reduced. Thus the ion beam etching working state passes to the normal one. The potential of the ions produced in the plasma formation chamber 1 is determined by the positive voltage (not shown in the figure) applied to the wall of the plasma formation chamber 1 and these ions are extracted as the ion beam 11 to the working chamber 2 by an electric field produced between the first grid 7 and the second grid 8.

In this way, according to this embodiment, since the electrons coming from the electron beam generator 15 for preventing the charging are introduced temporarily into the plasma formation chamber 1 and the high frequency discharge is started, using these electrons as seeds, neither a filament nor discharge electrode, used according to the prior art techniques, is necessary and it is possible to elongate the life of the device. Further, since the apparatus used heretofore for the production of the plasma can be used as it is, only by controlling its working sequence, the device according to this invention is very economical.

Figure 3:
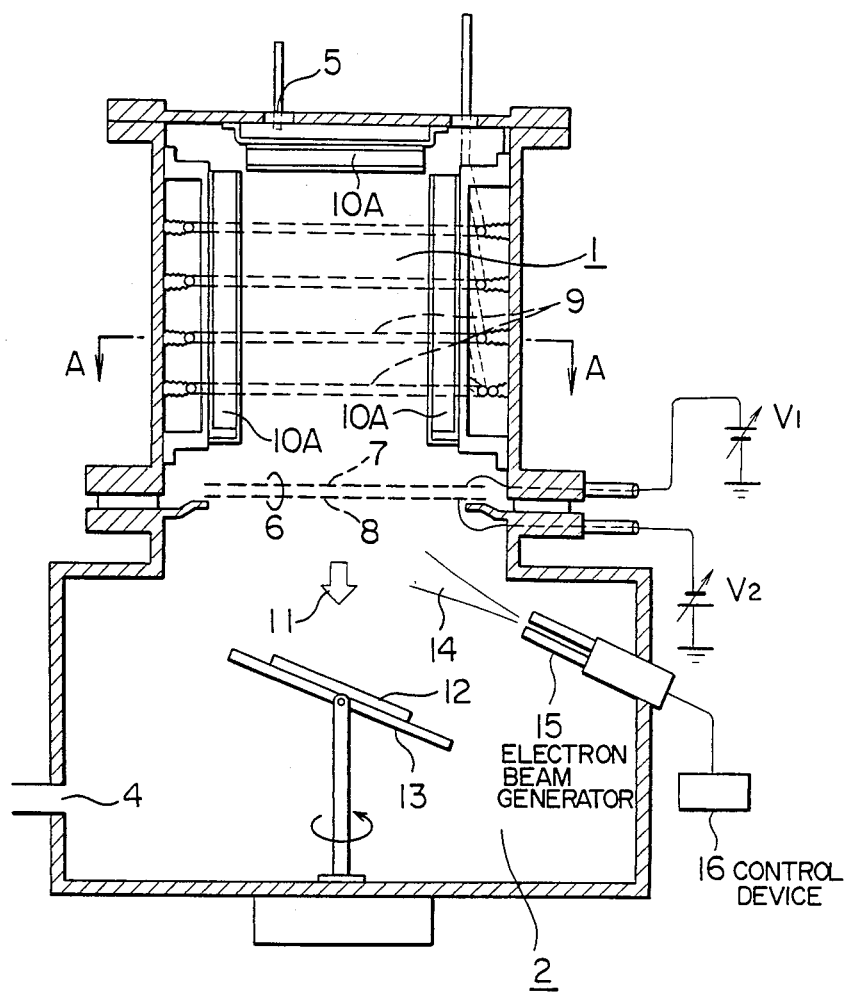
FIG. 3 is a longitudinal cross-sectional view illustrating another ion source application device, which is a second embodiment of this invention.
Figure 4:
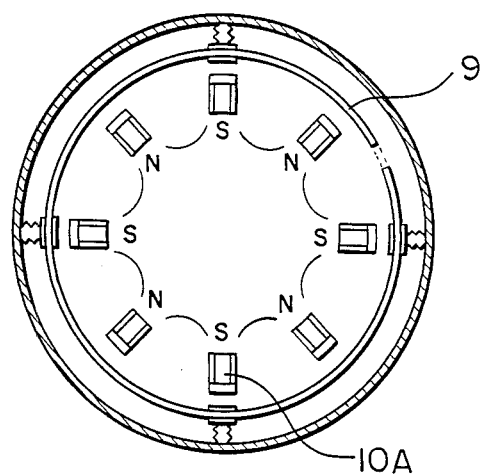
FIG. 4 is a cross-sectional view along the line A—A in FIG. 3.

FIG. 3 is a longitudinal cross-sectional view illustrating another ion source application device, which is a second embodiment of this invention and FIG. 4 is a cross-sectional view along the line A—A in FIG. 3.

The construction and the sequence for starting the high frequency discharge in the plasma formation chamber 1 in this embodiment are identical to those in the embodiment indicated in FIG. 1, except that the permanent magnets 10A for enclosing the plasma are located within the plasma formation chamber 1 and that the high frequency coil 9 is located between these permanent magnets 10A and the inner surface of the wall of the plasma formation chamber 1. Owing to this structure, since the plasma and the high frequency coil 9 can be separated by the permanent magnets 10A having a multiple structure, it is possible to prevent for the covering of the high frequency coil 9 to be injured by a chemically active plasma, which gives rise to its dielectric breakdown and to elongate further the life of the device.

Figure 5:
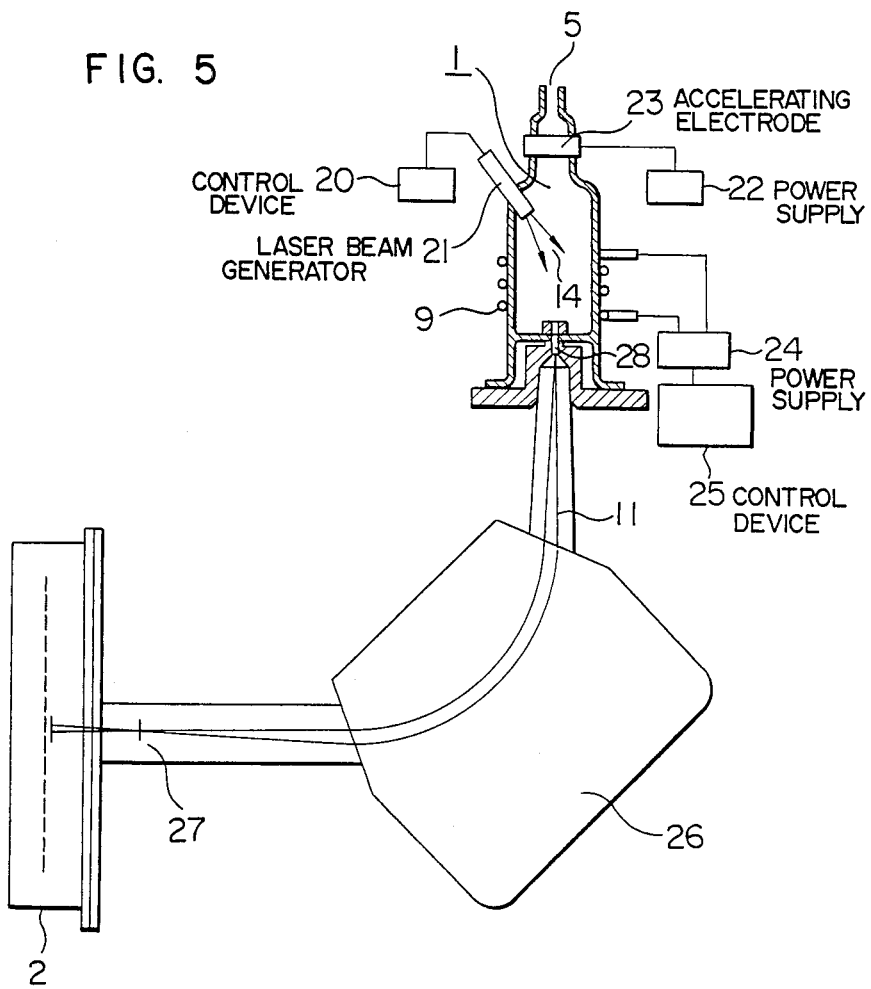
FIG. 5 is a longitudinal cross-sectional view illustrating still another ion source application device, which is a third embodiment of this invention.
Figure 6A:
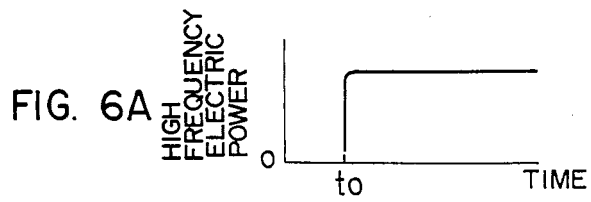
FIGS. 6A to 6D show a time chart for explaining the working mode at the high frequency discharge for the above third embodiment.
Figure 6B:
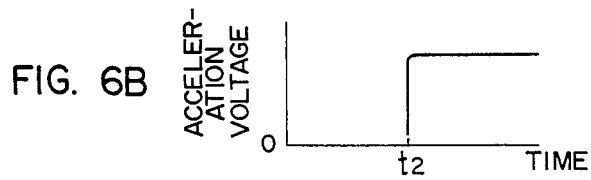
Figure 6C:
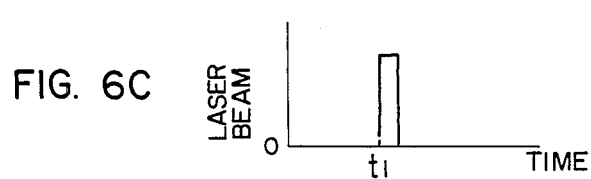
Figure 6D:
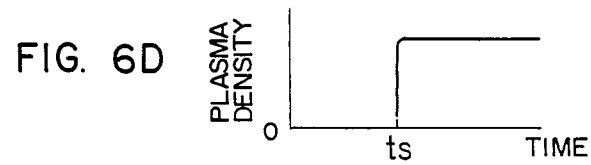

FIG. 5 is a longitudinal cross-sectional view illustrating still another ion source application device, which is a third embodiment of this invention, in which this invention is applied to an ion implantation device, which is not provided with any beam generator in the working chamber 2. For this device the gas inlet 5 is disposed at the upper part of the plasma formation chamber 1 having a vacuum chamber structure, whose side wall is made of an insulator. At the same time there are also disposed a laser beam generator 21 controlled by a control device 20 and an accelerating electrode 23, to which an acceleration voltage is applied by a power supply 22. Here the potential of the ions produced within the plasma formation chamber 1 is determined by the voltage applied to the accelerating electrode 23. Further, on the outside of the periphery of the plasma formation chamber 1 is disposed the high frequency coil 9, which is so constructed that the high frequency electric power supplied by a power supply 24 to the high frequency coil 9 and the potential applied to the outer wall of the plasma formation chamber 1 can be regulated by a control device 25. Since a hole 28 is formed at the center of the bottom of the plasma formation chamber 1 and the potential of the periphery of the hole 28 is equal to the ground potential, the ion beam 11 extracted to the exterior of the plasma formation chamber 1 by applying a high voltage to the accelerating electrode 23 is projected to a mass separator 26, in which only the ions having a predetermined energy are selected and after that a predetermined amount thereof is implanted to the object to be worked in the working chamber 2.

In this construction the high frequency electric power supplied to the high frequency coil 9, the acceleration voltage applied to the accelerating electrode 23 and the beam generation instruction given to the laser beam generator 21 are controlled with the sequence indicated in FIGS. ma to sd and in this way the high frequency discharge is started in the plasma formation chamber 1. That is, at a point of time $t_0$ the high frequency electric power is supplied to the high frequency coil 9. Thereafter at a point of time $t_1$ a light beam generated by the laser beam generator 21 during a predetermined period of time is projected to the plasma formation chamber 1 and a part of the introduced gas is ionized by irradiating a part of the plasma formation chamber with the laser light. Then, the high frequency discharge is started by using the electrons generated at this ionization at this time as seeds and after a point of time $t_S$ the discharge state is sustained. After that, at a point of time $t_2$ the acceleration voltage is applied, and the ion beam 11 is extracted from the plasma formation chamber 1, and introduced in the working chamber 2.

Consequently, also in this embodiment, the high frequency discharge is started without using any filament or discharge electrode.

In addition, although the high frequency discharge is started by projecting a laser beam in the plasma formation chamber in the embodiment described above, an electron may be utilized. Further, although the object to be worked is treated in the working chamber in the above embodiment, if the device is so constructed that the object to be worked is located in the plasma formation chamber so that it is brought into contact directly with the plasma, the device can be used as a dry etching device or a thin film formation device. Furthermore, in the embodiment indicated in FIG. 5 utilizing an electron beam generator, such generator may be mounted on the working chamber 2 side so that electrons are led to the plasma formation chamber 1.

As explained above, according to this invention, it is possible to start the high frequency discharge without disposing any filament or discharge electrode in the plasma formation chamber, even if it is used with a reactive gas atmosphere, neither frequent part exchange nor cleaning is necessary and it is possible to elongate the life of the ion source device. In addition, it is possible to obtain an ion beam, which is uniform in a wide region.

We claim:

1. An ion source application device comprising:
    gas tight plasma formation chamber means for sustaining a plasma produced by high frequency discharge;
    high frequency coil means, including a closed circuit, for producing said high frequency discharge;
    means for extracting an ion beam from the plasma thus produced;
    working chamber means for enclosing an object to be worked by said ion beam;
    electron beam generator means, disposed within said working chamber means, for generating an electron beam and for obtaining electrons serving as seeds for starting said high frequency discharge; and
    means for deflecting said electron beam toward said plasma formation chamber means, said deflecting means extracting electrons generated by said electron beam generator means in said working chamber means and enabling introduction of the extracted electrons into said plasma formation chamber means only when said high frequency discharge is to be started;
    wherein said electron beam generator means enables both starting of the plasma produced within said plasma formation chamber means and neutralizing of said ion beam within said working chamber means in common.

2. An ion source application device according to claim 1, wherein said electron beam is omnidirectional.

3. An ion source application device comprising:
    gas tight plasma formation chamber means for sustaining a plasma produced by high frequency discharge;
    high frequency coil means for producing said high frequency discharge;
    means for extracting an ion beam from the plasma thus produced; and
    laser light generator means for generating laser light for obtaining electrons serving as seeds for starting said high frequency discharge, said laser light generator means being at least partially disposed outside of said plasma formation chamber means.

* * * * *